(12) United States Patent
Schiffrin et al.

(10) Patent No.: US 10,033,149 B2
(45) Date of Patent: Jul. 24, 2018

(54) OPTO-ELECTRONIC DEVICE AND PULSE PROCESSING METHOD

(75) Inventors: Agustin Schiffrin, Munich (DE); Ralph Ernstorfer, Potsdam (DE); Ferenc Krausz, Garching (DE); Tim Paasch-Colberg, Munich (DE)

(73) Assignee: Max-Planck-Gesellschaft zur Foerderung der Wissenschaften e.V., Munich (DE)

(*) Notice: Subject to any disclaimer, the term of this patent is extended or adjusted under 35 U.S.C. 154(b) by 134 days.

(21) Appl. No.: 14/395,570

(22) PCT Filed: Apr. 20, 2012

(86) PCT No.: PCT/EP2012/001724
§ 371 (c)(1),
(2), (4) Date: Dec. 18, 2014

(87) PCT Pub. No.: WO2013/156045
PCT Pub. Date: Oct. 24, 2013

(65) Prior Publication Data
US 2015/0131685 A1    May 14, 2015

(51) Int. Cl.
*H01S 3/10*    (2006.01)
*H01L 31/09*    (2006.01)
(Continued)

(52) U.S. Cl.
CPC .............. *H01S 3/10* (2013.01); *G01J 11/00* (2013.01); *H01L 31/0328* (2013.01);
(Continued)

(58) Field of Classification Search
CPC ..... H01S 3/10; G01J 11/00; G01J 1/42; G01J 1/4238; H01L 31/09
See application file for complete search history.

(56) References Cited

U.S. PATENT DOCUMENTS

| 5,299,170 A * | 3/1994 | Shibata ................... G01J 11/00 356/491 |
| 5,754,292 A | 5/1998 | Kane et al. |

(Continued)

OTHER PUBLICATIONS

Hache et al. "Observation of Coherently Controlled Photocurrent in Unbiased, Bulk GaAs", Jan. 13, 1997.*

(Continued)

*Primary Examiner* — Marcia Golub-Miller
(74) *Attorney, Agent, or Firm* — Caesar Rivise, PC

(57) ABSTRACT

An opto-electronic device (100) for processing optical and electric pulses includes a photoconductor device (10) with a sensor section (11) which is made of a band gap material and which has electrical sensor contacts (12, 13), and a signal processing device (20) which is connected with the sensor contacts (12, 13), wherein the photoconductor device (10) is adapted to create a photocurrent between the sensor contacts (12, 13) in response to an irradiation with ultra-short driving laser pulses (1) having a photon energy smaller than the energy band gap of the band gap material, having a non-zero electric field component (3) oriented parallel with a line (4) between the electrical sensor contacts (12, 13), and causing a charge carrier displacement in the band gap material, and wherein the signal processing device (20) is configured for an output of an electric signal being characteristic for at least one of carrier-envelope phase (CE phase), intensity, temporal properties, spectral intensity and spectral phase of the driving laser pulses (1). Furthermore, a laser source device including the opto-electronic device and pulse processing method for processing optical and electric pulses are described.

8 Claims, 3 Drawing Sheets

(51) Int. Cl.
  *H01L 31/0328*  (2006.01)
  *G01J 11/00*  (2006.01)
  *H01L 31/0304*  (2006.01)

(52) U.S. Cl.
  CPC ........ *H01L 31/03044* (2013.01); *H01L 31/09* (2013.01); *Y02E 10/544* (2013.01)

(56) References Cited

U.S. PATENT DOCUMENTS

| | | | |
|---|---|---|---|
| 2006/0056480 A1* | 3/2006 | Mielke et al. | 372/94 |
| 2010/0166364 A1 | 7/2010 | Abad et al. | |
| 2012/0080672 A1* | 4/2012 | Rong | H01L 22/34 257/48 |
| 2014/0110572 A1* | 4/2014 | Li | G01J 1/0209 250/227.23 |
| 2015/0043056 A1* | 2/2015 | Capua | H01S 5/5054 359/330 |

OTHER PUBLICATIONS

Apolonski et al., "Controlling the phase evolution of few-cycle light pulses", Physical Review Letters, vol. 85, No. 4, pp. 740-743 (2000).
Apolonski et al., "Observation of light-phase-sensitive photoemission from a metal", Physical Review Letters, vol. 92, No. 7, pp. 073902-1 to 073902-4 (2004).
Auston, "Picosecond Optoelectronic Switching and Gating in Silicon", Appl. Phys. Lett., vol. 26, No. 3, pp. 101-103 (1975).
Auston, "Ultrafast Optoelectronics", Topics in Applied Physics, vol. 60, pp. 183-233 (1988).
Costa et al., "All-optical injection of ballistic electrical currents in unbiased silicon", Nature Physics, vol. 3, pp. 632-635 (2007).
Durach et al., "Metallization of Nanofilms in Strong Adiabatic Electric Fields", Physical Review Letters, vol. 105, pp. 086803-1 to 086803-4 (2010).
Franco et al., "Robust ultrafast currents in molecular wires through Stark shifts", Phys Rev Lett, vol. 99, pp. 1-5 (2007).
Fuji et al., "Self-stabilization of carrier-envelope offset phase by use of difference-frequency generation", Opt Lett, vol. 29, pp. 632-634 (2004).
Goulielmakis et al., "Direct Measurement of Light Waves", Science, vol. 305, pp. 1267-1269 (2004).
Jones et al., "Carrier-envelope phase control of femtosecond mode-locked lasers and direct optical frequency synthesis", Science, vol. 288, pp. 635-639 (2000).
Kane et al., "Single-Shot Measurement of the Intensity and Phase of an Arbitrary Ultra-short Pulse by Using Frequency-Resolved Optical Gating", Optics Letters, vol. 18, No. 10, pp. 823-825 (1993).
Katzenellenbogen et al., "Efficient Generation of 380 Fs Pulses of Thz Radiation by Ultrafast Laser-Pulse Excitation of a Biased Metal-Semiconductor Interface", Appl. Phys. Lett., vol. 58, pp. 222-224 (1991).
Keldysh, "Ionization in Field of a Strong Electromagnetic Wave", Soviet Physics JetP, vol. 20, No. 5, pp. 1307-1314.
Kienberger et al., "Atomic transient recorder", Nature, vol. 427, pp. 817-821 (2004).
Krausz, "Attosecond physics", Reviews of Modern Physics, vol. 81, No. 1, pp. 163-234 (2009).
Krueger et al., "Attosecond control of electrons emitted from a nanoscale metal tip", Nature, vol. 475, pp. 78-81 (2011).
Kurizki et al., "Phase-Coherent Control of Photocurrent Directionality in Semiconductors", Physical Review B, vol. 39, No. 4, pp. 3435-3437 (1989).
Nagatsuma, "Photonic measurement technologies for high-speed electronics", Meas. Sci. Technol., vol. 13, pp. 1655-1663 (2002).
Prechtel et al., "Time-Resolved Picosecond Photocurrents in Contacted Carbon Nanotubes", Nano Lett, vol. 11, pp. 269-272 (2011).
Schiffrin et al, "Optical-field-induced current in dielectrics", Nature, 493, 7430 (2013), Supplementary Information pp. 1-25 (2013).
Schiffrin et al. "Optical-field-induced current in dielectrics." Nature 493.7430 (2013): 70-74.
Schwierz et al., "RF transistors: Recent developments and roadmap toward terahertz applications", Solid State Electronics, vol. 51, pp. 1079-1091 (2007).
Shimosato et al., "Ultrabroadband Detection of Terahertz Radiation from 0.1 to 100 THz with Photoconductive Antenna", Springer Series Opti, vol. 132, pp. 317-323 (2007).
Telle et al., "Carrier-envelope offset phase control: A novel concept for absolute optical frequency measurement and ultrashort pulse generation", Appl Phys B, vol. 69, pp. 327-332 (1999).
Valley, "Photonic analog-to-digital converters", Optics Express, vol. 15, No. 5, pp. 1955-1982 (2007).
Wittmann et al., "Single-shot carrier-envelope phase measurement of few-cycle laser pulses", Nature Physics, vol. 5, pp. 357-362 (2009).
Wu et al., "High-frequency, scaled graphene transistors on diamond-like carbon", Nature, vol. 472, pp. 74-78 (2011).
Xu et al., "Route to phase control of ultrashort light pulses", Opt. Lett, vol. 21, pp. 2008-2010 (1996).
International Search Report for PCT/EP2012/001724 (dated 2013).
Kleimeier et al. (2010). "Autocorrelation and phase retrieval in the UV using two-photon absorption in diamond pin photodiodes". Optics Express 18(7): pp. 6945-6956.
European Patent Office Examination Report from corresponding EP 12716259.2 dated Feb. 12, 2015.

* cited by examiner

OPTO-ELECTRONIC DEVICE AND PULSE PROCESSING METHOD

TECHNICAL FIELD

The present invention relates to an opto-electronic device, being adapted for processing optical and electric pulses, in particular to an opto-electronic device being capable of fully diagnosing electric fields oscillating at optical frequencies (e.g. measuring the carrier-envelope phase of ultra-short laser pulses) and/or creating electric outputs resulting from the ultrafast processing of information encoded in electromagnetic fields with optical bandwidths. Furthermore, the present invention relates to a pulse processing method for processing ultra-short optical and electric pulses. Applications of the invention are available in the fields of operating and diagnosing (in particular stabilizing) laser sources, and/or electric signal processing.

TECHNICAL BACKGROUND OF THE INVENTION

In the present specification, reference is made to the following publications cited for illustrating prior art techniques and conventional implementations of certain procedural measures or partial aspects of processing optical and electric pulses.

[1] Fuji, T., Apolonski, A. & Krausz, F. Self-stabilization of carrier-envelope offset phase by use of difference-frequency generation. Opt Lett 29, 632-634 (2004);
[2] Telle, H. R. et al. Carrier-envelope offset phase control: A novel concept for absolute optical frequency measurement and ultrashort pulse generation. Appl Phys B-Lasers O 69, 327-332 (1999);
[3] Kane, D. & Trebino, R. Method and apparatus for measuring the intensity and phase of an ultrashort light pulse US patent (1992);
[4] Kane, D. J. & Trebino, R. Single-Shot Measurement of the Intensity and Phase of an Arbitrary Ultrashort Pulse by Using Frequency-Resolved Optical Gating. Opt Lett 18, 823-825 (1993);
[5] Kienberger, R. et al. Atomic transient recorder. Nature 427, 817-821 (2004);
[6] Goulielmakis, E. et al. Direct measurement of light waves. Science 305, 1267-1269 (2004);
[7] Schwierz, F. & Liou, J. J. RF transistors: Recent developments and roadmap toward terahertz applications. Solid State Electron 51, 1079-1091 (2007);
[8] Lin, Y. M. et al. High-frequency, scaled graphene transistors on diamond-like carbon. Nature 472, 74-78 (2011);
[9] Kurizki, G., Shapiro, M. & Brumer, P. Phase-Coherent Control of Photocurrent Directionality in Semiconductors. Phys Rev B 39, 3435-3437 (1989);
[10] Van Driel, H. M., Costa, L., Betz, M., Spasenovic, M. & Bristow, A. D. All-optical injection of ballistic electrical currents in unbiased silicon. Nature Physics 3, 632-635 (2007);
[11] Prechtel, L. et al. Time-Resolved Picosecond Photocurrents in Contacted Carbon Nanotubes. Nano Lett 11, 269-272 (2011);
[12] Franco, I., Shapiro, M. & Brumer, P. Robust ultrafast currents in molecular wires through Stark shifts. Phys Rev Lett 99, doi:Artn 126802 Doi 10.1103/Physrevlett.99.126802 (2007);
[13] Nagatsuma, T. Photonic measurement technologies for high-speed electronics. Measurement Science and Technology 13, 1655 (2002);
[14] Valley, G. C. Photonic analog-to-digital converters. Opt. Expr. 15, 1955-1982, doi:10.1364/oe.15.001955 (2007);
[15] Auston, D. H. Picosecond Optoelectronic Switching and Gating in Silicon. Appl. Phys. Lett. 26, 101-103 (1975);
[16] Auston, D. H. Ultrafast Optoelectronics. Topics in Applied Physics 60, 183-233 (1988);
[17] Shimosato, H., Ashida, M., Itoh, T., Saito, S. & Sakai, K. Ultrabroadband detection of terahertz radiation from 0.1 to 100 THz with photoconductive antenna. Springer Series Opti 132, 317-323 (2007);
[18] Katzenellenbogen, N. & Grischkowsky, D. Efficient Generation of 380 Fs Pulses of Thz Radiation by Ultrafast LaserPulse Excitation of a Biased Metal-Semiconductor Interface. Appl. Phys. Lett. 58, 222-224 (1991);
[19] Xu, L. et al. Route to phase control of ultrashort light pulses. Opt Lett 21, 2008-2010 (1996);
[20] Jones, D. J. et al. Carrier-envelope phase control of femtosecond mode-locked lasers and direct optical frequency synthesis. Science 288, 635-639 (2000);
[21] Apolonski, A. et al. Controlling the phase evolution of few-cycle light pulses. Phys Rev Lett 85, 740-743 (2000).
[22] Apolonski, A. et al. Observation of light-phasesensitive photoemission from a metal. Phys Rev Lett 92, 073902 (2004);
[23] Hommelhoff, P., Kruger, M. & Schenk, M. Attosecond control of electrons emitted from a nanoscale metal tip. Nature 475, 78-81 (2011);
[24] Wittmann, T. et al. Single-shot carrier-envelope phase measurement of few-cycle laser pulses. Nat Phys 5, 357-362, (2009);
[25] Keldysh, L. V. Ionization in Field of a Strong Electromagnetic Wave. Sov Phys Jetp-Ussr 20, 1307-& (1965).
[26] Durach, M., Rusina, A., Kling, M. F. & Stockman, M. I. Metallization of Nanofilms in Strong Adiabatic Electric Fields. Phys Rev Lett 105, 086803 (2010.

Ultra-short light pulses can be described in the time domain using a concept of a carrier wave formed by the electric field amplitude of light and an amplitude envelope. The carrier wave has a light frequency in the THz and beyond the PHz range. The relative position of the carrier wave with respect to the envelope is described with the carrier envelope phase (CE phase, $\varphi_{CE}$), which is e.g. $\varphi_{CE}=0$, if the maxima of the carrier wave and the envelope are coincident, or $\varphi_{CE}=+/-\pi/2$, if the carrier wave is zero at the maximum of the envelope. The CE phase influences physical effects of the laser pulses, e.g. in light-matter-interactions or light-light-superpositions. Typically, the CE phase is changing along a pulse train of laser pulses. The time derivation of the CE phase is called CE offset frequency $f_{CEO}$. In the frequency domain, ultra-short light pulses are represented by a spectrum of frequency components contributing to the light pulses (so-called frequency comb). The frequency spacing between the frequency components (comb frequencies) corresponds to the repetition frequency of the laser source device. The absolute positions of the comb frequencies additionally are influenced by the CE frequency. For obtaining stabilized laser source devices, in particular creating frequency combs with stabilized comb frequencies, there is a need for controlling and stabilizing the CE phase $\varphi_{CE}$ or the CE frequency.

Currently, the CE phase $\varphi_{CE}$ of ultra-short electromagnetic pulses can be measured via interferometric measurements ([1], [2]) and frequency-resolved optical gating methods ([3], [4]). Full characterization (i.e. full temporal or spectral structure of an electromagnetic observable) can be achieved via attosecond photoelectron spectroscopy ([5], [6]) which requires few- to sub-femtosecond laser pulses produced in free-electron laser facilities or by means of high-harmonic generation in ultra-high vacuum setups.

Conventional techniques for stabilizing laser sources based on the above approaches have essential disadvantages in terms of complexity and stability of the optical and electrical set-up. Accordingly, there are restrictions of stabilizing the CE phase $\varphi_{CE}$ of compact laser sources used under practical conditions.

In electronics technique, there is a general interest to process electronic signals with high processing frequencies. However, the above frequencies in the upper THz range and up to PHz range are not available for signal processing. As an example, prior art solid-state field-effect transistors (FET) are able to control currents at frequencies beyond ~100 GHz only ([7], [8]). All-optical injection of currents via interfering photo-excitation pathways ([9] to [12]) or photoconductive switching of THz transients ([13] to [18]) offer the capability of controlling electronic current on a sub-picosecond timescale in semiconductors.

OBJECTIVE OF THE INVENTION

It is an objective of the present invention to provide an improved opto-electronic device for processing optical and electric pulses, being capable of avoiding disadvantages of conventional techniques. In particular, the opto-electronic device is to be capable of fully characterizing electric fields oscillating at light frequencies. For example, in the case of few cycle optical fields, the invention is to be capable of determining the absolute CE phase with a compact and reliable set-up. According to another particular aspect, the opto-electronic device is to be capable of outputting electric signals which are the result of ultrafast processing of information encoded in optical input signals. Such processing is to be performed with near- and beyond-petahertz (PHz) bandwidths. Furthermore, it is an objective of the present invention to provide an improved pulse processing method for processing ultra-short optical and electric pulses, being capable of avoiding disadvantages of conventional techniques.

These objectives are solved with methods and devices as defined in the independent claims, resp. Advantageous embodiments and applications of the invention are defined in the dependent claims.

SUMMARY OF THE INVENTION

According to a first aspect of the invention, an optoelectronic device is provided, which is adapted for processing optical and electric pulses and which includes a photoconductor device and a signal processing device. The photoconductor device includes a sensor section which is made of a band gap material and which has electrical sensor contacts (collecting electrodes). The signal processing device is coupled with the sensor contacts. The photoconductor device is arranged to be irradiated with ultra-short laser pulses having a photon energy smaller than the energy band gap of the band gap material. The laser pulses are capable of displacing (moving) charge carriers in the band gap material. Therefore the laser pulses are called driving laser pulses. The optoelectronic device is configured such that the charge carriers are generated either by the driving laser pulses or by additional injection laser pulses. The photo-generated charge carriers are subsequently driven by the electric field of the laser pulses. The electric field of the driving laser pulses has a non-zero component oriented in parallel with a straight line between the electrical sensor contacts. The driving laser pulses create a photocurrent between the sensor contacts in response to the irradiation of the sensor section. The photocurrent is a net photocurrent being caused by the laser pulse mediated motion of the charge carriers independently of a biased or non-biased condition of the band gap material.

According to the invention, the signal processing device is configured for an output of an electric signal (electric output signal) being characteristic for at least one of phase, e.g., CE phase, intensity, temporal and spectral properties, e.g., spectral intensity and spectral phase, of the driving laser pulses. The inventors have found, that the photocurrent created by the driving laser pulses can be used for generating and outputting the electric output signal. With preferred applications of the invention, the electric output signal provides the simultaneous capability for full characterization of few cycle electromagnetic waveforms via the direct electronic readout, and electronic signal processing at light frequencies, i.e. up to and beyond PHz frequencies.

The invention is based on the ultra-fast manipulation of the electric charge carriers in the bandgap material, which can be e.g. a semiconductor or insulator, by exploiting ultrashort electromagnetic waveforms, i.e., the driving laser pulses. In particular, the inventors have found, that optically generated electric currents not only can be directly measured using the sensor contacts, e.g. collecting metal electrodes, in contact with the photo-active bandgap material. While directly measurable electric current is driven, directed, and/or switched within the band gap material at the frequency of the oscillating electromagnetic fields of the exploited driving laser pulses, the electric output signal can be provided by the signal processing device for further applications even with a frequency of the waveform of laser pulses.

The experimental observations of the inventors demonstrate that electronic signals of a solid-state can be controlled on the timescale of the period of an electromagnetic wave (i.e. fs here), and this incurring little dissipation. The operation cycle is analogous to that occurring in a field-effect transistor (FET). The invention can be exploited in prospective high-speed electronics and photonics. In particular, systems can be provided where an electric output signal encodes the result of information processed and/or operations performed at clock frequencies of the incident control radiation: the electronic output is computed according to the parameters of the electromagnetic tools. Moreover, the invention enables the development of a solid-state device for direct sampling of the electric and/or magnetic field of transient electromagnetic waveforms with bandwidths up to the frequency of light.

Whereas existing methods provide carrier-envelope phase information ([2], [19] to [24]) and even fully characterize the electric field of few-cycle electromagnetic waveforms with vacuum-based setups [5], the inventive approach represents an unprecedented means to fully sample electric fields oscillating at light frequencies with a compact solid-state device operating e.g. in ambient atmosphere and e.g. at room temperature.

The charge carriers can be displaced anisotropically in the band gap material by the electric field of the driving laser pulses. Since the time-integral of a propagating electromagnetic field is zero, a non-zero displaced charge occurs only when the generation event overlaps in time with the driving electric field. In other words, the electric field of the same electromagnetic waveform can generate the charge carriers and subsequently imprint a net momentum change. This results in an electric photocurrent. As the electric field of the driving laser pulses has a non-zero component oriented in parallel with a line between the electrical sensor contacts, the photocurrent can be detected and measured by the electrical sensor contacts. The anisotropic charge carrier displacement depends on the CE phase of the driving laser pulse, on the spectral components of the driving laser pulse, on the spectral phase of the driving laser pulse, on the intensity of the driving laser pulse, and on the polarization of the driving laser pulse. The spectral intensity and spectral phase of the driving laser pulse defines the temporal structure of the driving laser pulse. Thus, at least one of the CE phase, intensity, temporal structural, spectral intensity and spectral phase of the driving laser pulses can be absolutely determined by the output signal.

According to a second aspect of the invention, a laser source device is provided which comprises a pulse source device being configured for creating ultra-short driving laser pulses and the opto-electronic device according to the above first aspect of the invention. According to the invention, the laser source device further comprises a control loop being capable of controlling the pulse source device in dependency on the electric output signal of the signal processing device. For example, the absolute CE phase of a laser pulse of the pulse train can be retrieved by measuring the photo-induced electric output signal. The feedback loop can subsequently act on the parameters of the laser source such as to minimize variations of the CE phase, e.g., act on the intensity of the pump laser of a titanium-sapphire (Ti:Sapph) oscillator, but not limited to that.

Preferably, the pulse source device is adapted for creating the driving laser pulses with a spot size (i.e. four times the beam waist, where the beam waist is defined as the distance from the center of the beam where the intensity decays by a factor of $1/e^2$) at the sensor section which is equal or larger than the length of the shortest line joining the electrical sensor contacts.

Preferably, the pulse source device is adapted for creating few cycle laser pulses. The terms "few cycle laser pulse" or "few cycle optical fields" refer to a laser pulse or light field having a pulse duration $\tau_P$ of the amplitude envelope and a light field period $\tau_L$ of the carrier wave, wherein the pulse duration $\tau_P$ at most is one order of magnitude larger than the light field period $\tau_L$. The pulse duration is defined as the full-width half-maximum of the time-dependent pulse intensity. With increasing pulse duration, the number of cycles within one pulse increases as well. If the pulse duration is too large, the efficiency of moving charge carriers is decreased. Thus, with a few cycle laser pulse $\tau_P \leq 10\tau_L$, preferably $\tau_P \leq 5\tau_L$, particularly preferred $\tau_P \leq 3\tau_L$, e.g. $\tau_P \leq 2\tau_L$. For example, for a pulse in the visible/infrared spectral range with a period $\tau_L$ of 2.5 fs, the pulse duration $\tau_P$ of the driving few cycle laser pulse should be below 25 fs, preferably below 15 fs, particularly preferred below 8 fs, e.g. below 5 fs.

According to a third aspect of the invention, a pulse processing method for processing optical and electric pulses is provided, which comprises a step of creating ultra-short driving laser pulses, in particular few cycle laser pulses, with a pulse source device and a step of irradiating a photoconductor device with the driving laser pulses, said photoconductor device including a sensor section which is made of a band gap material and which has electrical sensor contacts. The photon energy of the driving laser pulses is smaller than the energy band gap of the band gap material. In response to the irradiation of the sensor section, a photocurrent is created between the sensor contacts by an anisotropic charge carrier motion in the band gap material. According to the invention, the pulse processing method further includes a step of providing an electric signal being characteristic for at least one of CE phase, intensity, temporal structure, spectral intensity and spectral phase the driving laser pulses. Preferably, the pulse processing method is implemented using the opto-electronic device according to the above first aspect of the invention.

Advantageously, multiple applications of the electric output signal are available in optics, laser technique and/or electronics. The present invention can be exploited for the full characterization of electromagnetic waveforms via the measurement of the photo-generated electric signal in the solid band gap material or for electronic signal processing up to and beyond PHz frequencies. Thus, according to a preferred embodiment of the invention, the electric output signal can be an electric control signal for controlling a pulse source device creating the driving laser pulses. In particular, the electric output signal can be used for adjusting and/or stabilizing the CE phase of laser pulses created with the pulse source device (see example mentioned above). According to further preferred embodiments of the invention, the electric output signal is at least one of a logic operator signal to be input to a logic processing unit, a switching signal and a sampling signal for sampling of electric and/or magnetic field of the electromagnetic transient waveforms.

According to particularly preferred embodiments of the invention, the photoconductor device is configured such that a photoinduced electric current is created in a characteristic time scale $\tau = 1/\upsilon$ below 10 fs (i.e. frequency $\upsilon$ above 100 THz), in particular $\tau$ below 5 fs (i.e. $\upsilon > 200$ THz), e.g. $\tau$ below 2 fs (i.e. $\upsilon$ above 500 THz) or r below 1 fs (i.e. v above 1 PHz). Advantageously, this characteristic time scale of an electric signal cannot be reached with any conventional technique. Thus, the signal processing device can be configured such that the electric output signal is a function of electronic processes occurring at the photoconductor device in the aforementioned time scales. For example, logical signals representing "1" and "0" can be generated and/or processed, or the electric field of transient electromagnetic waveforms can be sampled with the aforementioned time resolutions and frequency bandwidths. In particular, binary logic operations can be achieved on information encoded in the properties of the driving laser pulses at the time scales and clock frequencies mentioned above.

According to a further advantage, implementation of the present invention is not restricted to a particular band gap material. Multiple band gap materials are available, which preferably have a band gap energy $E_g$ larger than the thermal energy available at the operation temperature of the opto-electronic device, in particular a minimum band gap energy of at least 1 meV. Thus, the charge carriers in the band gap material can be created exclusively by the influence of the driving laser pulses or alternatively exclusively by the field effect of injection laser pulses mentioned below. As preferred examples, the band gap material may comprise a semiconductor or insulator material, e.g., GaN, GaAs, Si, sapphire, $SiO_2$ or diamond. These materials have additional advantages in terms of thermal stability during irradiation with the ultra-short laser pulses.

According to a further preferred embodiment of the invention, the opto-electronic device can be provided with a cooling device. According to this embodiment, an operation temperature of the photoconductor device can be adjusted. Advantageously, this allows a stabilization of the band gap material temperature even during the irradiation with the ultra-short laser pulses, and a thermal excitation of the band gap material can be excluded. Furthermore, the operation temperature adjustment allows to use materials, which at room temperature would have a band gap energy below the above minimum band gap energy, i.e., smaller than the thermal energy available at room temperature.

Although the net charge carrier motion in the band gap material is driven by the light field of the driving laser pulses, an externally generated bias voltage can be applied to the sensor contacts. This would allow for the tuning of the level/offset of the output electric signal. The application of a bias voltage might be required for further signal processing.

The invention is based on exploiting ultrashort few cycle electromagnetic waveforms for the manipulation of charge carriers in the solid-state photo-active circuit. The circuit is composed of the band gap material connected to the sensor contacts. Advantageously, two basic mechanisms of charge carrier generation can be used.

In the first case, the photoconductor device is arranged for an irradiation with the driving laser pulses such that the charge carriers are generated by the non-linear interaction of the driving laser pulses with the band gap material, and the generated charge carriers are displaced by the driving laser pulse. The charge carrier generation occurs in the connected band gap material via non-linear interactions between the band gap material and the driving laser pulses. In such mechanism the energy band gap is larger than the photon energy of the ultra-short driving laser pulse. Due to the nonlinearity of the process, the charge generation takes place within a fraction of the period of the driving pulses. The photocurrent is created where the polarity is defined by the electric field of the electromagnetic waveform. Thus, the anisotropic motion of the charge carriers is effected, which is sensed between the sensor contacts when the electric field of the driving laser pulses has a non-zero component oriented in parallel with a straight line between the electrical sensor contacts.

In the second case, the photoconductor device is arranged for an irradiation with ultra-short injection laser pulses synchronized with the driving laser pulses. The injection and driving pulse have a non-zero temporal and spatial overlap at the sensor section. Preferably, the overlap is selected such that the driving laser pulses impinge on the sensor section of the photoconductor after the injection laser pulses with a time delay smaller than the period of the driving laser pulses. In this second case, two scenarios are possible for the charge carrier injection. In the first scenario, charge carriers are generated via 1-photon absorption by injection laser pulses with photon energies $\hbar\omega_L^{(i)}$ on the order of the energy band gap $E_g$ of the band gap material. The duration (defined as the full-width half-maximum if the time-dependent pulse intensity) of the injection pulses is on the same order of magnitude or smaller than the period of the synchronized driving laser pulses. In a second scenario, charge carriers are generated/injected via non-linear interaction between the injection laser pulses and the band gap material. The injection laser pulses have a photon energy smaller than the energy band gap of the band gap material, like the driving laser pulses of the above first case. The duration of the injection laser pulses is on the same order of magnitude or smaller than the pulse duration of the driving laser pulses. The polarization of the injection pulses is tuned such that no net current is detected between the sensor contacts. Examples of such non-linear interactions between the injection laser pulses and the band gap material can be optical field effect and multiphoton processes, but not limited to these.

Subsequently, the charge carriers generated by the injection laser pulses are exposed to the electric field of the synchronized driving laser pulses. Again, a non-zero net charge displacement occurs when the injection and driving mechanisms overlap in time. The polarization of the driving laser pulses is tuned such that the electric field of the driving laser pulses has a non-zero component oriented in parallel with a line between the electrical sensor contacts. The photon energy of the driving laser pulse is smaller than the energy band gap of the band gap material, as in the first case. In this second case, generation and driving of the charge carriers are temporally decoupled. The ultrafast charge carrier injection confined to a fraction of the period of the electric field of the driving laser pulses allows for the temporal sampling of electric field of the electromagnetic waveform. This can be exploited for the full characterization (i.e. spectral and/or temporal) of few-cycle electromagnetic waveforms or for ultra-fast electronic signal processing. The inventors have demonstrated the second case by using intense few-cycle visible/near-infrared (VIS/NIR) laser pulses: electronic signal processing at near-petahertz (PHz) frequencies was achieved as shown below.

BRIEF DESCRIPTION OF THE DRAWINGS

Further details and advantages of the invention are described in the following with reference to the attached drawings, which show in.

PREFERRED EMBODIMENTS OF THE INVENTION

Embodiments of the invention are described in the following with exemplary reference to the figures which schematically show in particular the photoconductor device with electrical sensor contacts. It is emphasized that the implementation of the invention is not restricted to the illustrated embodiments, but is rather possible with other designs providing a sensor section exposed for an irradiation with laser pulses. In particular, the size and shape of the photoconductor device can be selected in dependency on the particular conditions of using the invention. Furthermore, the implementation of the invention is possible by integrating the optoelectronic device into an optical set-up as it is known from conventional pulse laser techniques.

Figure 1:
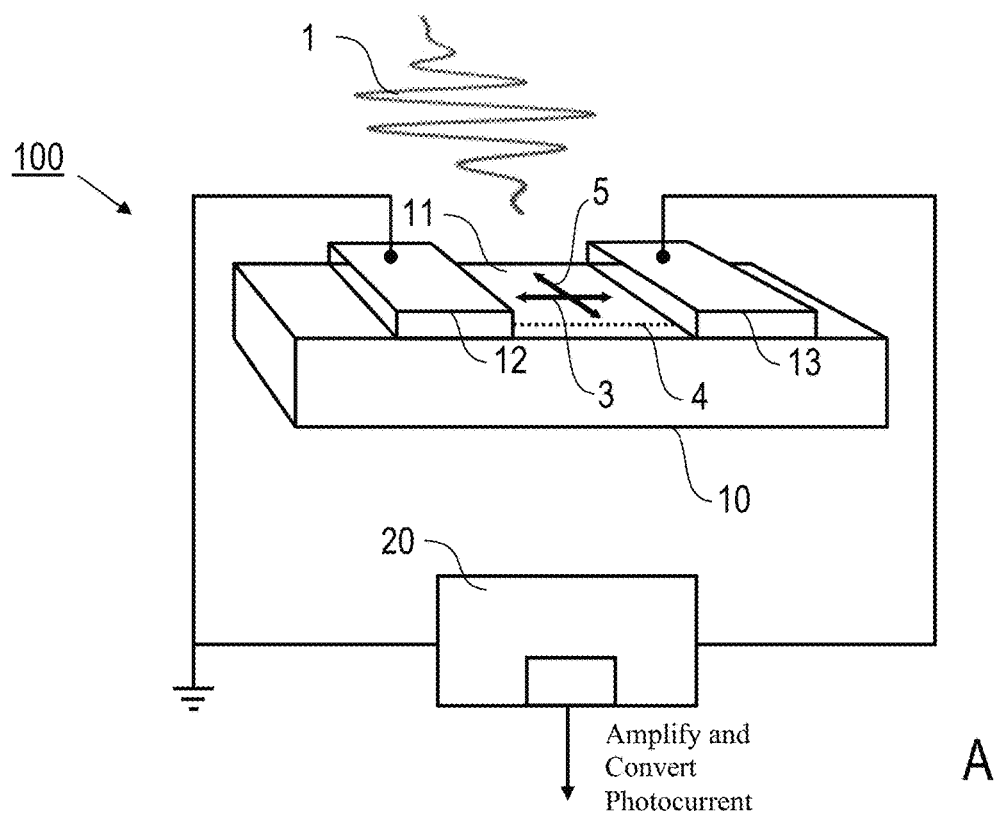
FIG. 1: schematic illustrations of embodiments of an optoelectronic device according to the invention.
Figure 1:
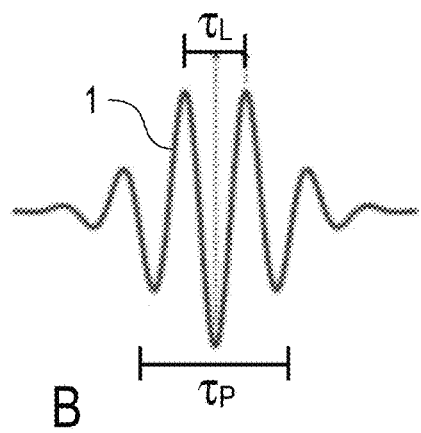
Figure 1:
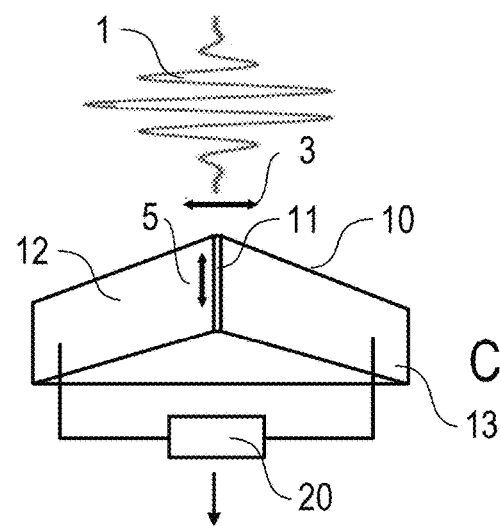

FIG. 1A shows a first embodiment of an opto-electronic device 100 including a photoconductor device 10 with a sensor section 11 and electrical sensor contacts 12, 13 (collecting electrodes), and a signal processing device 20 which is connected with the sensor contacts 12, 13. The photoconductor device 10 is made of a band gap material, e.g. a semiconductor, like GaN, GaAs, or Si, or a dielectric, like $SiO_2$, carrying the sensor contacts 12, 13, which are made of e.g. gold layers. The sensor contacts 12, 13 are arranged with a distance where the band gap material is exposed for an irradiation with ultra-short driving laser pulses 1. The exposed portion of the band gap material provides the sensor section 11. The distance between the sensor contacts 12, 13 is selected to be smaller than or equal to the spot size (spot size defined as about four times the beam waist, where the beam waist is defined as the distance from the center of the beam where the intensity decays by a factor of $1/e^2$) of the laser pulses, in particular in a range between e.g. 20 nm and 500 µm (but not limited to these values). The driving laser pulses 1 are created using a laser source (not shown in FIG. 1A) generally with a photon energy smaller than the energy band gap of the band gap material, in the example where $SiO_2$ is the band gap material e.g. with a centre wavelength of e.g. 750 nm and with a pulse duration of e.g. 4 fs. The opto-electronic device 100 can be operated unbiased (as shown) or with the signal processing device 20 biased (i.e. applying a DC voltage and avoiding breakdown). The driving laser pulses 1 are few-cycle pulses as illustrated in FIG. 1B, e.g., the light-field period r, is about a half or a third of the pulse duration $\tau_P$.

The implementation of the invention is not restricted to the planar shape of the band gap material as shown in FIG. 1A. With an alternative embodiment shown in FIG. 1C, the photoconductor device 10 can have prismatic shape, wherein the sensor contacts 12, 13 are thin layers, e.g. made of gold, on a prismatic body of the band gap material, e.g. $SiO_2$. At an edge of the prismatic body, the band gap material is exposed so that the sensor section 11 is formed between the sensor contacts 12, 13. Furthermore, the photoconductor device 10 can be connected with a cooling device (not shown) for thermally stabilizing the band gap material and avoiding thermal generation of charge carriers.

With alternative embodiments of the invention, the optical set-up can include an active beam stabilization of the laser pulses onto the sensor section in order to decouple external mechanical vibrations. Optionally, isolation from external electronic noise can be improved by enclosing the optoelectronic device in a Faraday cage-like setup, by ensuring that the bandgap material is electrically connected only to the sensor contacts and/or by avoiding ground loops (but not only limited to these techniques).

In response to the irradiation of the sensor section 11 charge carriers are created and moved in the band gap material so that a net photocurrent is detectable between the sensor contacts 12, 13. The signal processing device 20 comprises an amplifier circuit for amplifying and/or converting the net photocurrent, e.g. a high-gain low-noise current-to-voltage converter (I/V). Furthermore, the signal processing device 20 includes an output section 21 which is adapted for an output of an electric signal being characteristic for at least one of CE phase, intensity, temporal properties, spectral phase and spectral intensity of the driving laser pulses 1.

Further details of physical fundaments of creating and moving the charge carriers are described in the following. The driving laser pulses 1 having an intense few-cycle electromagnetic waveform with time-dependent electric field and angular frequency $\omega_L$ irradiate the solid-state photoactive circuit (sensor section 11). The photo-active device is composed of the band gap material ($\hbar\omega_L < E_g$) connected to the sensor contacts 12, 13 which enables a direct electronic readout of the photo-induced electric signal. $F_{laser}(t)$ has a polarization such that a non-zero component 3 is oriented in parallel with a line 4 between the electrical sensor contacts, but no component 5 perpendicular to said line 4. Note that dotted line 4 is shown in FIG. 1A for illustrative purposes. Preferably, the non-zero component 3 is perpendicular to edges of the sensor contacts. However, other geometries are possible, which provide a net component in a direction connecting the sensor contacts. A photo-induced electric current density j(t) is generated in the band gap material via a 2-step process:

(1) $F_{laser}(t)$ interacts non-linearly with the electrons of the material and generates charge carriers in a time window confined to a fraction of the period $\tau_L$ of $F_{laser}(t)$ via multiphoton electron excitation from a valence band to a conduction band, or via a transient optical-field-induced alteration of the static electronic structure of the material (see e.g. [25] or [26]; and (2) $F_{laser}(t)$ subsequently imprints a net momentum change to the charge carriers, resulting in a time-dependent electric current density j(t). The displaced charge per pulse or integrated current $$Q_P \sim \int_{-\infty}^{+\infty} j(t)\,dt$$

is amplified in the high-gain low-noise current-to-voltage converter (I/V) supporting the bandwidth of the pulse train and can be directly measured by the circuit. $Q_P$ depends on the time-structure of $F_{laser}(t)$, and the measurement of $Q_P$ allows the determination of the absolute CE phase $\varphi_{CE}$. Such measurement enables the stabilization of the $\varphi_{CE}$ for each pulse of the pulse train when an active feedback-loop acts on the parameters of the laser source of few-cycle electromagnetic waveforms such that CE phase $\varphi_{CE}$ is constant (see e.g. FIG. 3).

Figure 2:
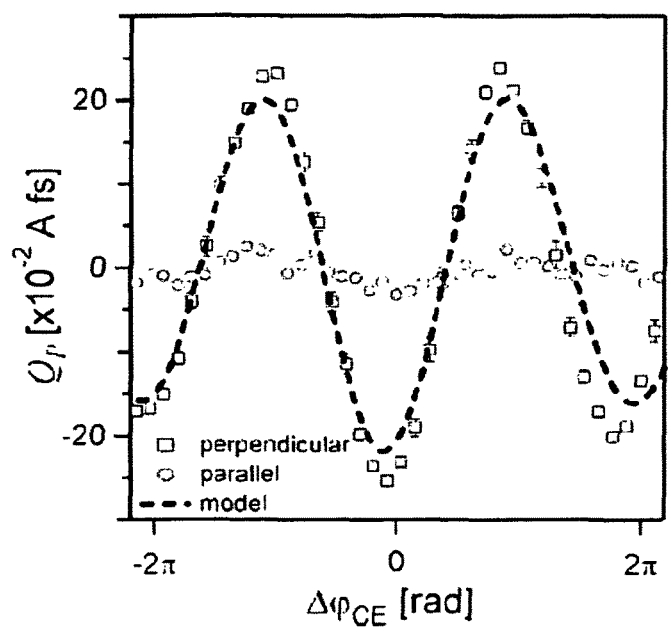
FIG. 2: experimental results obtained with the optoelectronic devices of FIG. 1.

FIG. 2 shows experimental results obtained by irradiating an unbiased gold-silica-gold junction as depicted in FIG. 1A or 1C with a linearly polarized $\varphi_{CE}$-stable few-cycle VIS/NIR laser pulse with photon energy $\hbar\omega_L \approx 1.7$ eV. The energy bandgap $E_g$ of silica ($SiO_2$) is ~9 eV. The field $F_{laser}(t) = F_0 f(t)\sin(\omega_L t + \varphi_{CE})$ of the optical waveform has a sub-4-fs (normalized) envelope fit) and is polarized perpendicularly to the electrodes (i.e. parallel to a straight line 4 between the electrical sensor contacts; squares in FIG. 2) or parallel (i.e. perpendicular to a straight line 4 between the electrical sensor contacts; circles), with $F_0 \sim 1.5$V/Å. Charge carriers are injected in the material via strong optical-field-induced interband tunneling. The black dashed line plots the theoretical prediction given by numerical solutions of the one-electron time-dependent Schrödinger equation (TDSE). For the polarization parallel to the electrodes, the signal is suppressed by more than an order of magnitude as the charge carriers are moved perpendicular to a line 4 between the electrical sensor contacts.

With further details, FIG. 2 plots $Q_P$ which is detected by the signal processing device 20 during exposure to a single laser pulse as a function of the change of $\varphi_{CE}$. When $\Delta\varphi_{CE} = \pi$, $Q_P$ reverses its polarity. The electronic signal is induced directly by the instantaneous electric field laser $F_{laser}$ and carries the signature of $\varphi_{CE}$, which can be measured with an excellent signal-to-noise ratio and a reliable high-fidelity with a simple solid-state device. The experimental observation enables the development of a feedback scheme for $\varphi_{CE}$ stabilization such as the one depicted in FIG. 3 described in the following.

Figure 3:
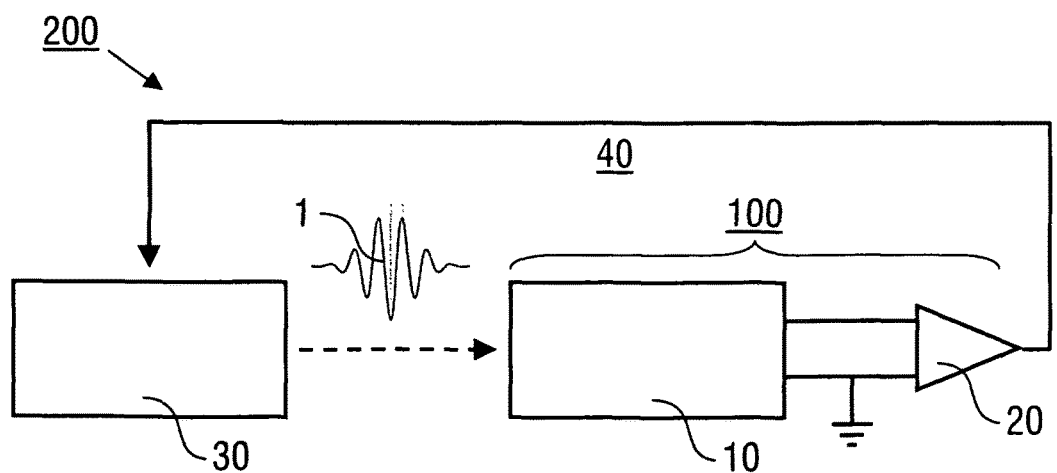
FIG. 3: a schematic illustration of an embodiment of a laser source device according to the invention.

FIG. 3 shows an embodiment of a laser source device 200, which comprises a pulse source device 30 creating ultra-short driving laser pulses 1 and the opto-electronic device 100, e.g. according to FIG. 1A or 1C, with the photoconductor device 10 and the signal processing device 20. The output section of the signal processing device 20 is connected with the pulse source device 30 thus forming a control loop 40. With the control loop 40, the pulse source device 30 is controlled based on the electric output signal of the signal processing device 20 such that the CE phase $\varphi_{CE}$ has a predetermined value and/or is stabilized.

The pulse source device 30 is a laser source of few-cycle electromagnetic waveforms, e.g. a Ti:Sapphire oscillator pumped by a pump laser. As an example, for controlling the CE phase $\varphi_{CE}$, the output signal of the signal processing device 20 is used for adjusting the intensity of the pump laser such that $\varphi_{CE}$ is constant.

With other embodiments of the invention, the control loop 40 can be used for stabilizing intensity or spectral properties of the pulse source device 30 in dependency of the output signal of the signal processing device 20.

Figure 4:
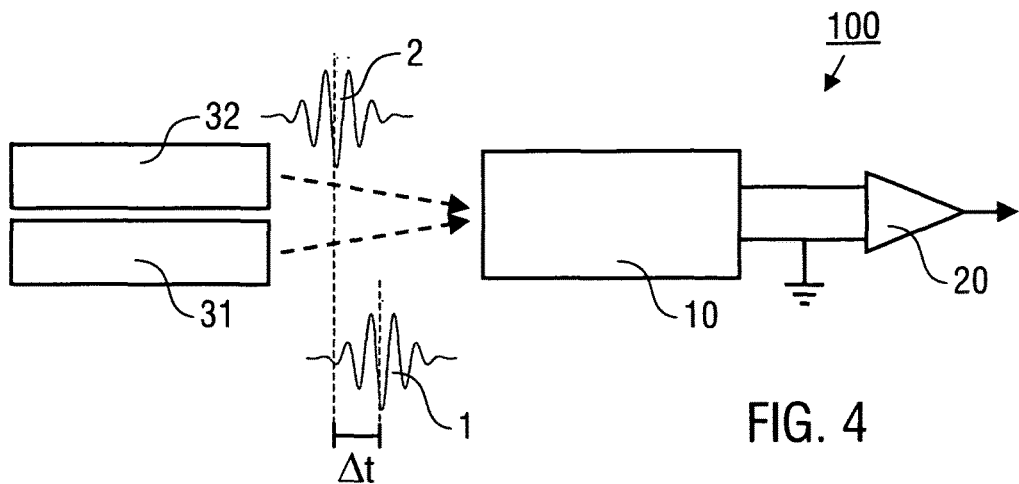
FIG. 4: a schematic illustration of a further embodiment of an opto-electronic device according to the invention.
Figure 5:
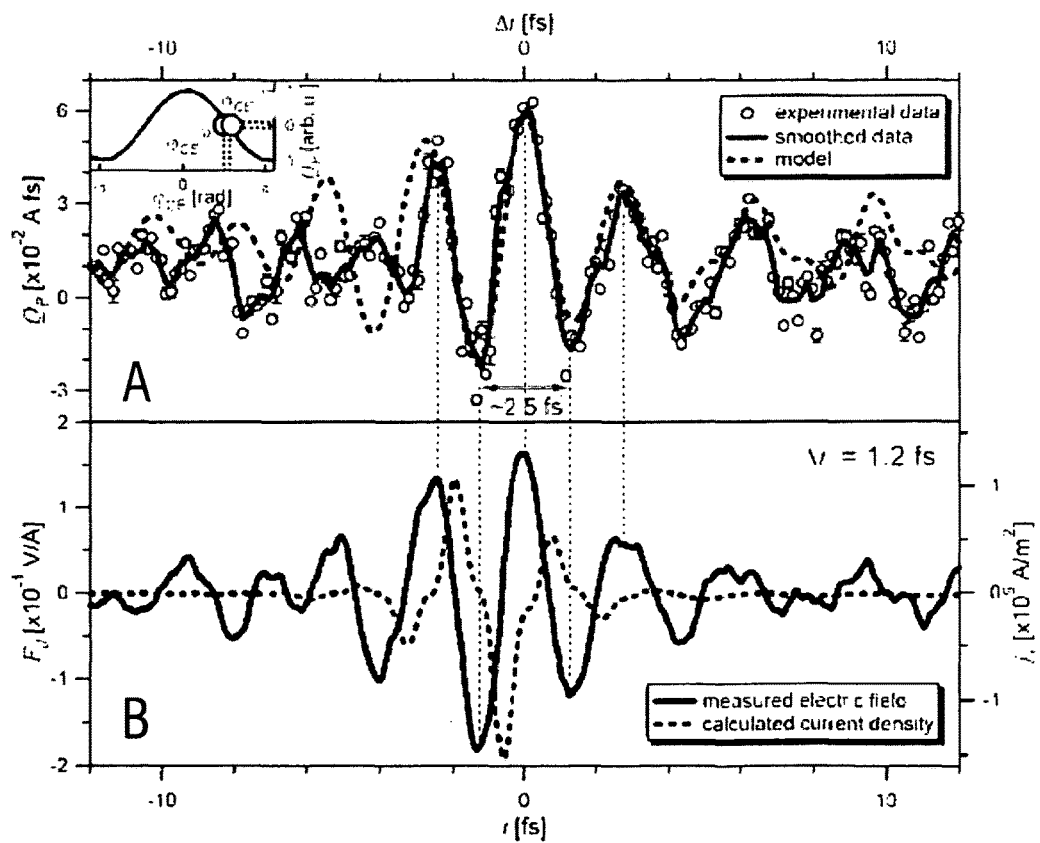
FIG. 5: experimental results obtained with the optoelectronic device of FIG. 4.

According to an alternative embodiment of the invention, the creation (injection) and the driving (motion) of the charge carriers in the band gap material can be decoupled by exposing the solid-state photoactive circuit to two synchronized electromagnetic waveforms with electric fields $F_i(t)$ (injection laser pulses 2) and $F_d(t)$ (driving laser pulses 1) as shown in FIGS. 4 and 5. $F_d(t)$ has a non-zero component oriented in parallel with a line between the electrical sensor contacts. $F_i(t)$ has no component parallel to $F_d(t)$ (see 4 in FIG. 1). The opto-electronic device 100 includes a photoconductor device 10 and a signal processing device 20 as shown e.g. in FIG. 1. The driving laser pulses 1 are created with a first laser source 31, e.g. a pumped Ti:Sapphire oscillator, while the injection laser pulses 2 are created with a second laser source 32, e.g. an amplified Ti:Sapphire oscillator. The first and second laser sources 31, 32 are synchronized relative to each other such that the driving laser pulses 1 have a fixed time delay $\Delta t$ relative to injection laser pulses 2 when irradiating the photoconductor device 10. The time delay $\Delta t$ is tuned with a time resolution smaller than the period of the driving laser pulses, and in the range from e.g. −12 fs to 12 fs (e.g. FIG. 5).

The field $F_i(t)$ of the injection laser pulses 2 generates charge carriers in the band gap material and the field $F_d(t)$ of the driving laser pulses 1 imprints a net moment change to the carriers. Here, the photocurrent $Q_P$ is a function of the time delay $\Delta t$ between $F_i(t)$ and $F_d(t)$: $Q_P(\Delta t)$ carries the full information of the temporal structure of $F_d(t)$.

The injection laser pulses 2 can be designed according to two different variants for a non-linear charge carrier generation or a linear charge carrier generation.

With the non-linear charge carrier generation, $F_i(t)$ is strong (i.e. $F_0^{(i)}$ of the order of magnitude of the nucleus-electron Coulombic interaction in the material), ultrashort and has a low photon energy with respect to the band gap of the material (i.e. $\hbar\omega_L^{(i)} < E_g$). The physics of the charge carrier generation are identical to the case of FIGS. 1A and 10. The field $F_i(t)$ of the injection laser pulses 2 is oriented (polarized) such that the measuring circuit is not sensitive to any photodisplaced charge (e.g. $F_i(t)$ perpendicular to a normal line connecting the electrical sensor contacts). In this scenario, the pulse duration $\tau_P^{(i)}$ of the injection field $F_i(t)$ is on the same order of magnitude or smaller than the pulse duration $\tau_P^{(d)}$ of the driving field $F_d(t)$.

Alternatively, with the linear charge carrier generation, the duration of the field $F_i(t)$ of the injection laser pulses 2 can be on the same order of magnitude or smaller than the period of $F_d(t)$ (i.e. $\tau_P^{(i)} \leq \tau_L^{(d)}$ and with $\hbar\omega_L^{(1)} \sim E_g$). In this case, charge carriers are generated via 1-photon absorption in the band gap material, promoting valence band electrons to the conduction band. A second weaker ($F_0^{(d)}$ such that no charge carriers are generated by $F_d(t)$ independently), few-cycle $\varphi_{CE}$-stable electromagnetic waveform with electric field $F_d(t)$ and photon energy $\hbar\omega_L^{(d)} < E_g$ is synchronized to $F_i(t)$. $F_d(t)$ is oriented such that $F_d(t)$ imprints a momentum change to the charge carriers generated by $F_i(t)$ in a direction where the measuring circuit is sensitive to the photo-induced electronic motion in the material (e.g. $F_d(t)$ is oriented with a non-zero component in the direction perpendicular to the straight contacted electrodes). The measurement of $Q_P$ provides full information of $F_d(t)$.

Again, such experiments can be performed with the measuring circuit biased (i.e. applying a DC voltage and avoiding breakdown) or unbiased. $F_i(t)$ and $F_d(t)$ can be applied to the junction in a collinear or non-collinear geometry.

FIG. 5A shows the photocurrent $Q_P$ as a function of $\Delta t$ when $F_i(t)$ and $F_d(t)$ are the electric fields of linearly polarized $\varphi_{CE}$-stable VIS/NIR pulses (scheme as with non-linear charge carrier generation) irradiating a gold-fused silica-gold junction according to FIG. 1C. $F_i(t)$ has a peak field amplitude $F_0^{(i)} \sim 2V/\text{Å}$ polarized parallel to the collecting electrodes, and $F_d(t)$ is weak with $F_0^{(d)} \sim 0.2V/\text{Å}$. The delay $\Delta t$ between the peaks of $F_i(t)$ and $F_d(t)$ determines the timing of carrier injection with respect to the drive field and, hence, the momentum which $F_d(t)$ is able to transfer to the carriers. The carrier-envelope phases of the injection $\varphi_{CE}^{(i)}$ and drive $\varphi_{CE}^{(d)}$ pulses are set in order to suppress the current induced by any of the fields independently (see FIG. 2).

In FIG. 5B, it is shown that $Q_P(\Delta t)$ reflects the oscillatory behaviour of $F_d(t)$: the light field governs the current that emerges from the dielectric medium and is measured in the external circuit. The measured electronic signal samples the oscillations of the electric field of the drive laser pulse $F_d(t)$: compare $Q_P(\Delta t)$ with the electric field waveform of the drive pulse retrieved from attosecond streaking measurements (see [5]). Such sampling of the electric field of light is possible if the sampling interval is shorter than the half cycle of the oscillating sampled signal. The injection of carriers in the dielectric is confined to a time window on the order of the drive period $\tau_L^{(d)}$ i.e. ~1 fs in the depicted case.

The theoretical curves in FIGS. 2 and 5B correspond to solutions of the one-electron time-domain Schrödinger equation (TDSE) for a finite (~120 nm) dielectric film exposed to a strong optical field. The dependence (dashed lines) of $Q_P$ on $\varphi_{CE}$ (FIG. 2), as well as on $\Delta t$ are in excellent agreement with the experimental results. The physical interpretation is based on strong-optical-field-induced change of the static electronic structure of the dielectric, resulting in the transient collapse of the band structure. The consequence is a reversible increase of conductivity by 19 orders of magnitude with respect to the static dc conductivity of amorphous $SiO_2$, which can be switched 'on' and 'off' in the time scale of the optical period.

The features of the invention disclosed in the above description, the figures and the claims can be equally significant for realizing the invention in its different embodiments, either individually or in combination.

The invention claimed is:

1. A pulse processing method for processing optical and electric pulses, comprising the steps of
   creating ultra-short driving laser pulses having an oscillating electric field oscillating at optical frequencies with a pulse source device,
   irradiating a photoconductor device which operates unbiased and which includes a sensor section which is made of a band gap material and which has electrical sensor contacts, wherein a photon energy of the driving laser pulses is smaller than an energy band gap of the band gap material and wherein the driving laser pulses have a few-cycle electromagnetic waveform with the electric field and a non-zero electric field component oriented parallel with a line perpendicular to edges of the electrical sensor contacts, said few-cycle electromagnetic waveform having a pulse duration corresponding to a full-width half-maximum of a time-dependent pulse intensity, and a light field period of a carrier wave, wherein the pulse duration at most is one order of magnitude larger than the light field period, wherein the oscillating electric field generates charge carriers in the band gap material by a non-linear interaction between the driving laser pulses and the band gap material and this same oscillating electric field directly drives a displacement of the charge carriers, resulting in a pulse-shaped photocurrent between the sensor contacts, amplifying and converting the photocurrent and generating an electric signal being characteristic for at least one of CE phase, intensity, temporal properties, spectral intensity and spectral phase of the driving laser pulses, and output of the electric output signal.

2. The pulse processing method according to claim 1, wherein the photoconductor device is irradiated with the driving laser pulses having a spot size at the sensor section being equal or larger than a length of a shortest line joining the electrical sensor contacts.

3. The pulse processing method according to claim 1, including the step of providing the electric signal as an electric control signal for controlling the pulse source device creating the driving laser pulses.

4. The pulse processing method according to claim 1, including the step of providing the electric signal as at least one of a logic operator signal, a switching signal and a sampling signal for sampling of a transient electric field of the driving laser pulses.

5. The pulse processing method according to claim 1, wherein the electric signal is a function of the driving laser pulses oscillating with at least one of frequencies above 100 THz and bandwidths above 100 THz.

6. The pulse processing method according to claim 1, wherein the electric signal is a result of an operation performed at clock frequencies above 100 THz, on information encoded in at least one of carrier-envelope phase (CE phase), intensity, temporal properties, spectral intensity and spectral phase of the driving laser pulses.

7. The pulse processing method according to claim 1, wherein the energy band gap of the band gap material is larger than a thermal energy available at an operation temperature of the opto-electronic device.

8. The pulse processing method according to claim 1, further including the step of adjusting a temperature of the photoconductor device with a cooling device.

* * * * *